United States Patent
Park

(10) Patent No.: US 7,983,077 B2
(45) Date of Patent: Jul. 19, 2011

(54) PHASE CHANGE MEMORY APPARATUS

(75) Inventor: Kyoung Wook Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 107 days.

(21) Appl. No.: 12/494,587

(22) Filed: Jun. 30, 2009

(65) Prior Publication Data

US 2010/0290275 A1    Nov. 18, 2010

(30) Foreign Application Priority Data

May 15, 2009    (KR) .................. 10-2009-0042605

(51) Int. Cl.
 *G11C 11/00*    (2006.01)

(52) U.S. Cl. ............... 365/163; 365/148; 365/210.1; 365/210.15

(58) Field of Classification Search .............. 365/163, 365/148, 210.1, 210.15
See application file for complete search history.

(56) References Cited

U.S. PATENT DOCUMENTS

| | | | |
|---|---|---|---|
| 7,522,449 B2 | 4/2009 | Ro et al. | |
| 2007/0236987 A1* | 10/2007 | Cho et al. | 365/163 |
| 2008/0074918 A1 | 3/2008 | Ro et al. | |
| 2008/0101111 A1 | 5/2008 | Chang | |
| 2009/0067227 A1 | 3/2009 | Kang et al. | |
| 2009/0073753 A1* | 3/2009 | Osada et al. | 365/163 |
| 2009/0109728 A1* | 4/2009 | Maejima et al. | 365/148 |
| 2009/0168493 A1* | 7/2009 | Kim et al. | 365/148 |

FOREIGN PATENT DOCUMENTS

| | | |
|---|---|---|
| JP | 2007-157317 A | 6/2007 |
| KR | 100764738 B1 | 10/2007 |

* cited by examiner

*Primary Examiner* — Vu A Le
*Assistant Examiner* — Han Yang
(74) *Attorney, Agent, or Firm* — Ladas & Parry LLP

(57) ABSTRACT

A phase change memory apparatus is presented. The phase change memory apparatus includes a phase change memory cell, a sense amplifier, and a voltage selecting unit. The sense amplifier is configured to differentially amplify a current that through the memory cell and a comparison voltage. The voltage selecting unit is configured to provide a reference voltage as the comparison voltage when performing a normal read function and to selectively provide either a first voltage level or a second voltage level as the comparison voltage in accordance with data when performing a verify read function.

10 Claims, 5 Drawing Sheets

PHASE CHANGE MEMORY APPARATUS

CROSS-REFERENCES TO RELATED PATENT APPLICATION

The present application claims priority under 35 U.S.C 119(a) to Korean Application No. 10-2009-0042605, filed on May 15, 2009, in the Korean Intellectual Property Office, which is incorporated herein by reference in its entirety as set forth in full.

BACKGROUND

1. Technical Field

The present invention relates to a memory apparatus, and more particularly, to a phase change memory apparatus.

2. Related Art

Generally, a phase change memory apparatus performs a write verify function that verifies whether or not data has been correctly stored in a memory cell. The write verify function is usually performed as follows. First, logic-high data or logic-low data are written in the memory cell and the data stored in the memory cell is read by a verify read function. When the written data and the read data do not conform to each other, then data are rewritten in the memory cell. Subsequently another verify read function, which reads the data stored in the memory cell, is performed. When the written data and the read data finally conform to each other, then the write verify function ends.

The write verify function is needed to be performed to store correct data in the memory cell so that the data can be assured as being the correct output when performing a normal read operation. The data stored in the memory cell can be output by using an amplification function of a sense amplifier that differentially amplifies a current that penetrates through the memory cell and a reference voltage.

FIG. 1 is a diagram showing distribution of data that are stored in the memory cell of a conventional phase change memory apparatus.

Referring now to FIG. 1, it can be appreciated that the logic high data are distributed at an upper side and the logic low data are distributed at a lower side based on a reference voltage 'Vref0'. An area that distinguishes the difference between the logic high data and the logic low data is a sensing window. Whether the data stored in the memory cell is the logic high or not is discriminated by the sensing window as a sensing margin.

The conventional phase change memory apparatus appropriately controls the amount of current penetrating through the memory cell. That is, when performing the write verify function, the current level of an input signal 'SAI' of a sense amplifier secures the sensing window. However, the input signal 'SAI' of the sense amplifier can adversely influenced by fluctuation in the process/voltage/temperature (PVT), which causes problems in reducing the sensing window. As a result of the sensing window's uncontrolled reduction can lead to malfunctions in the phase change memory apparatus.

SUMMARY

A phase change memory apparatus capable of securing a sufficient sensing window is described herein.

In one embodiment, a phase change memory apparatus includes a phase change memory cell and performs a write verify function. The phase change memory apparatus is configured to write first or second level data and when the first level data are written, performs a verify read function at a first voltage, and when the second level data are written, performs the verify read function at a second voltage.

In another embodiment, a phase change memory apparatus includes a memory cell, a sense amplifier configured to differentially amplify and output a current thatthrough the memory cell and a comparison voltage and a voltage selecting unit configured to selectively provide a first voltage or a second voltage as a comparison voltage according to data when performing a verify read function and provides a reference voltage as the comparison voltage when performing a normal read function.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Figure 1:
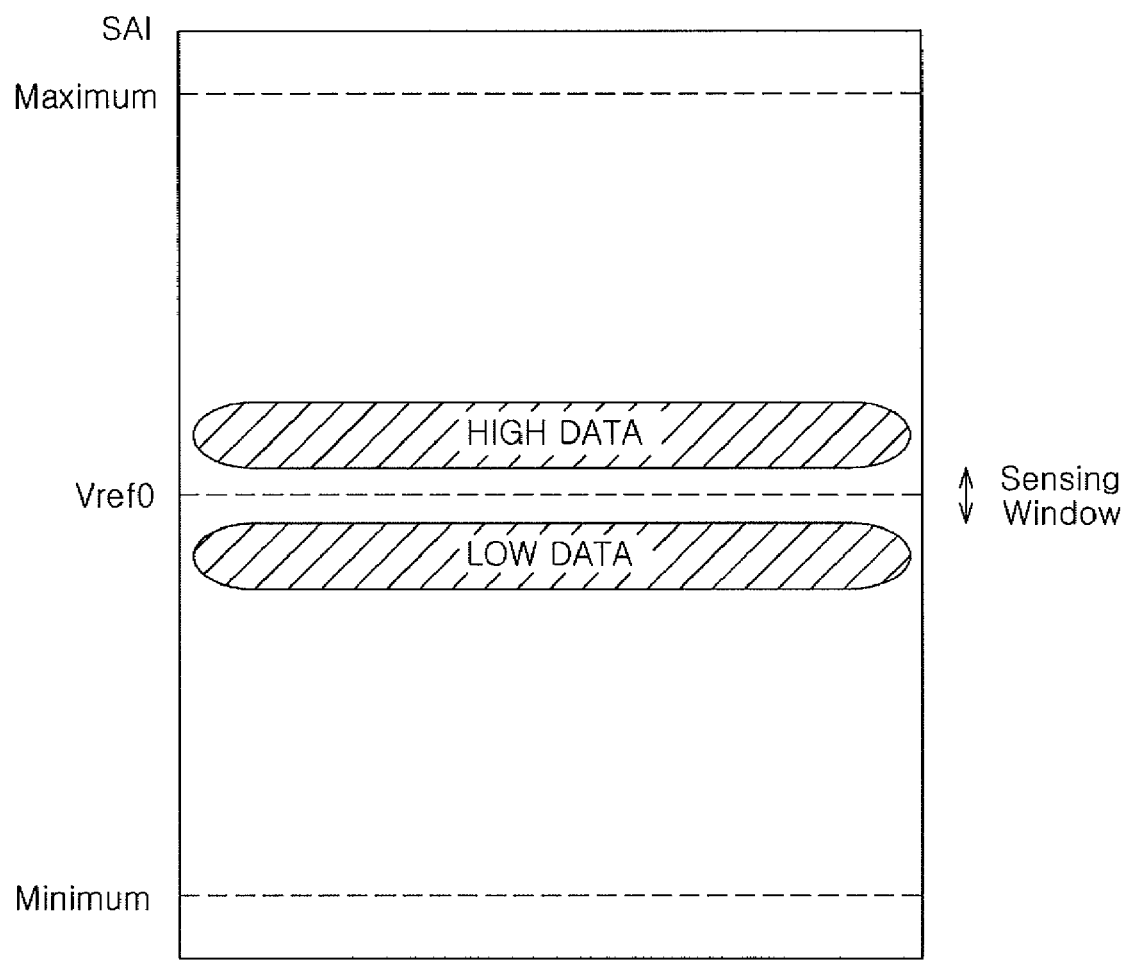
FIG. 1 is a diagram showing distribution of data that are stored in a memory cell of a conventional phase change memory apparatus.
Figure 2:
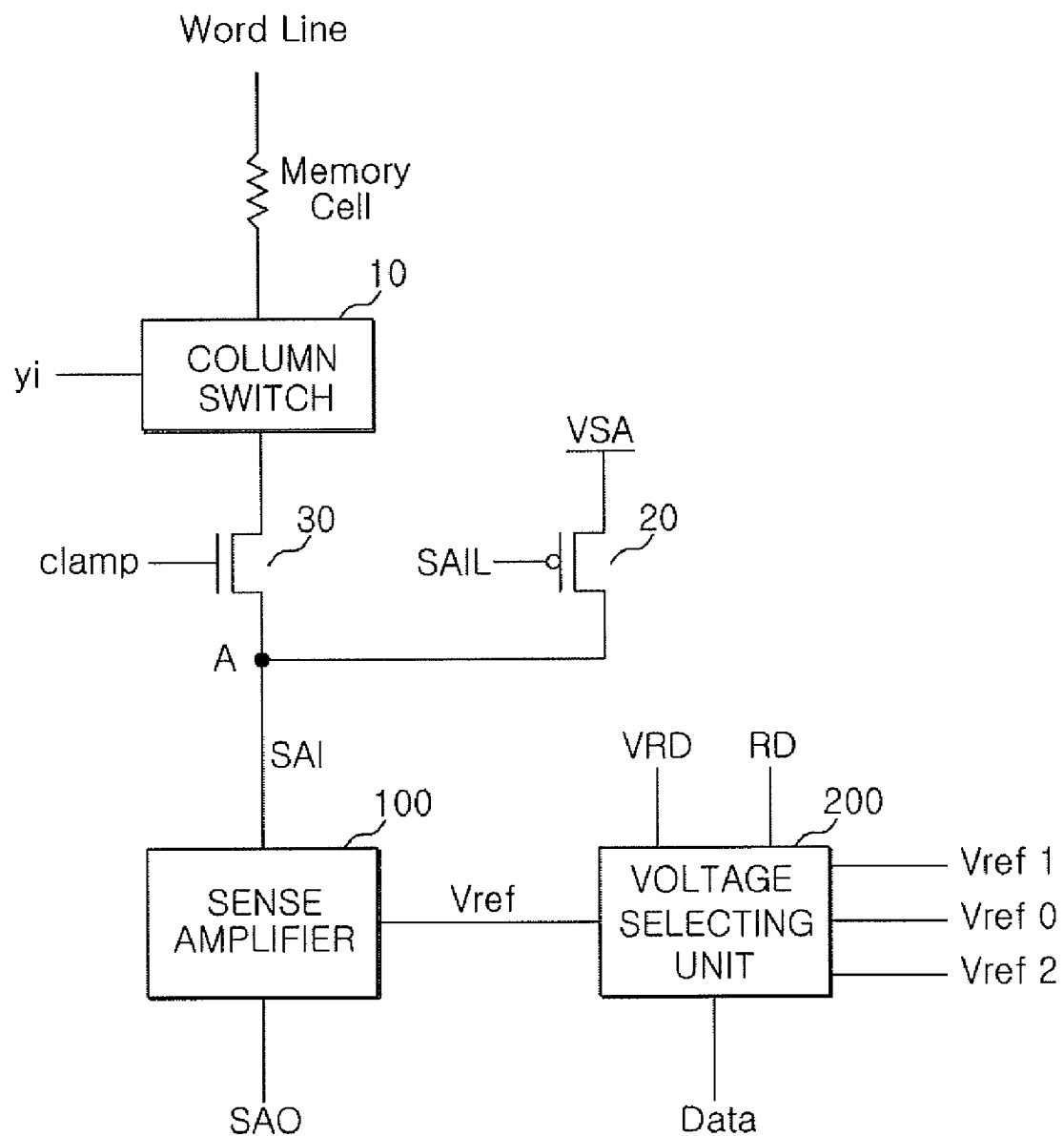
FIG. 2 is a diagram schematically showing a configuration of the phase change memory apparatus according to the embodiment.

FIG. 2 is a diagram schematically showing a configuration of a phase change memory apparatus according to the embodiment.

In FIG. 2, a phase change memory apparatus 1 according to the embodiment can include a memory cell, a column switch 10, a bias transistor 20, a clamping transistor 30, a sense amplifier 100, and a voltage selecting unit 200.

The memory cell stores data and is operated by being connected to a word line. The column switch 10 is turned-on in response to a column selection signal 'yi' that is enabled to select a column in accordance with a column address.

The bias transistor 20 applies a power supply voltage 'VSA' to a common node 'A' in response to a biasing signal 'SAIL' in order to sense the data of the memory cell.

The clamping transistor 30 performs clamping within a voltage range, suitable to read the data of the memory cell, in response to the clamping signal 'clamp'. Specifically, the clamping transistor 30 performs clamping to a predetermined voltage lower than a threshold voltage level of a phase change material that forms the memory cell. The reason for clamping the predetermined voltage to be lower than a threshold voltage level of a phase change material is that when the voltage level is at or above the threshold voltage then the phase change material composing the memory cell can be changed.

When the column selection signal 'yi', the biasing signal 'SAIL', and the clamping signal 'clamp' are enabled in order to sense the data of the memory cell, a power supply voltage 'VSA' is applied to the memory cell, such that the current, which penetrates through the memory cell, is output as the sense amplifier input signal 'SAI' from the common node 'A' in accordance with the resistance value of the memory cell.

The column switch 10, the bias transistor 20, and the clamp transistor 30 are the same as the configuration in the conventional art.

The sense amplifier 100 differentially amplifies the sense amplifier input signal 'SAI' and the comparison voltage 'Vref' level and generates an output signal 'SAO'.

The voltage selecting unit 200 provides the comparison voltage 'Vref' to the sense amplifier 100. The voltage selecting unit 200 can provide one of a first voltage 'Vref1', a reference voltage 'Vredf0', and a second voltage 'Vref2' as the comparison voltage 'Vref' in response to data 'Data', a verify read signal 'VRD', and a normal read signal 'RD'.

The phase change memory apparatus generally performs a write verify function to confirm whether or not correct data are stored in the memory cell. In other words, when performing the write verify, the first level data or the second level data are written in the memory cell and the verify read function is performed to read the data of the memory cell to confirm whether that the written data conforms to the read data. When the written data conforms to the read data, the write verify function is completed. When the written data does not conform to the read data are rewritten and then the verifying and reading functions of the data is repeated. The verify read signal 'VRD' is a signal that can be input from the outside of the phase change memory apparatus in order to perform the verify read function.

The voltage selecting unit 200 provides one of the first voltage and the second voltage 'Vref1 and Vref2' as the comparison voltage 'Vref' when performing the verify read function and the reference voltage 'Vref0' is provided as the comparison voltage 'Vref' when performing the normal read function.

Specifically, the voltage selecting unit 200 provides one of the first voltage and the second voltage 'Vref1 and Vref2' as the comparison voltage 'Vref' when the verify read signal 'VRD' is enabled. The voltage selecting unit 200 provides the reference voltage 'Vref0' as the comparison voltage 'Vref' when the verify read signal 'VRD' is disabled and when the normal read signal 'RD' is enabled. In addition, when the verify read signal 'VRD' is enabled, the voltage selecting unit 200 provides the first voltage 'Vref1' to the comparison voltage 'Vref' if the data 'Data' is the first level and the voltage selecting unit 200 provides the second voltage 'Vref2' is provided as the comparison voltage 'Vref' if the data 'Data' is the second level.

In the embodiment, the first level represents a logic high and the second level represents a logic low. Further, in the embodiment, it is preferable that the first voltage 'Vref1' is a voltage higher than the reference voltage 'Vref0' and the second voltage 'Vref2' is a voltage lower than the reference voltage 'Vref0'. The reference voltage 'Vref0' is a voltage corresponding to about half that of power supply voltage 'VSA'.

Therefore, the sense amplifier 100 receives one of the first voltage 'Vref1', the reference voltage 'Vref0', and the second voltage 'Vref2' as the comparison voltage 'Vref' in accordance with the verify read function, the normal read function, and the data, compares it with the sense amplifier input signal 'SAI', and performs the differential amplification function.

Figure 3:
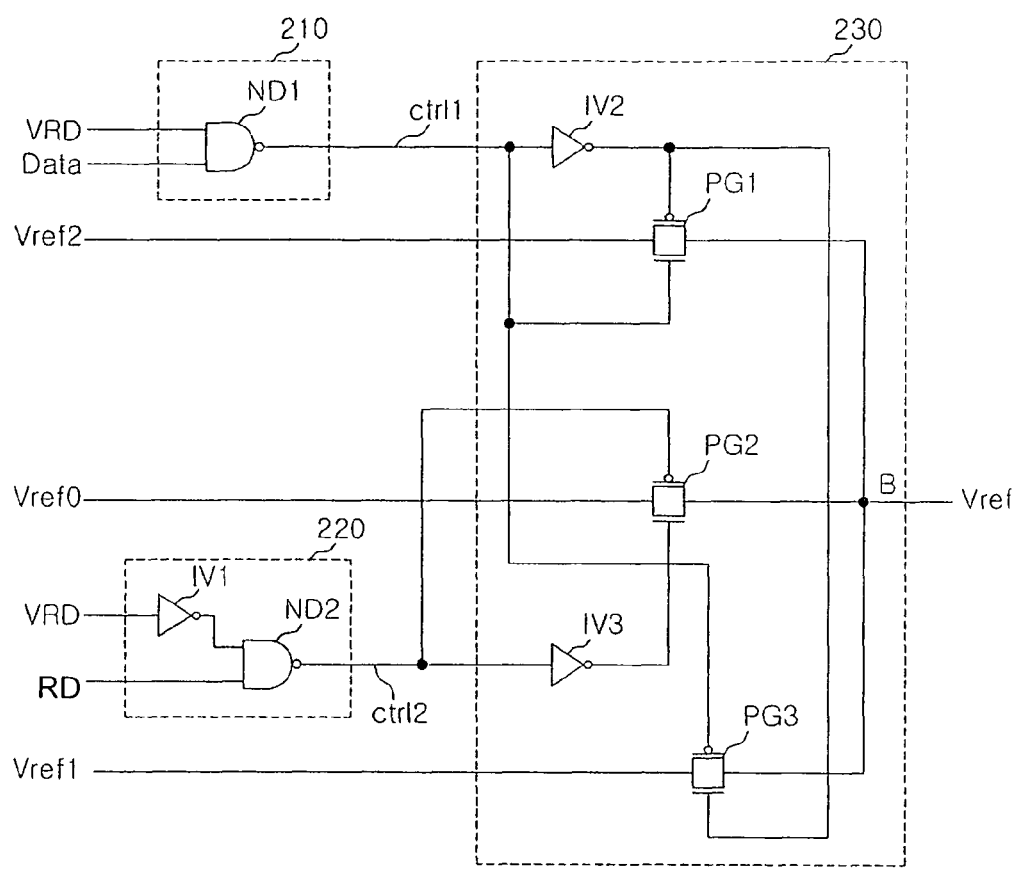
FIG. 3 is a diagram showing a configuration of an embodiment of a voltage selecting unit of FIG. 2.

Referring now to FIG. 3 which is a diagram schematically showing a configuration of an embodiment of the voltage selecting unit of FIG. 2. In FIG. 3, the voltage selecting unit 200 can include a verify read controller 210, a normal read controller 220, and an output unit 230. The verify read controller 210 generates a first control signal 'ctrl1' in response to the verify read signal 'VRD' and the data 'Data'. When the verify read signal 'VRD' is enabled, the verify read controller 210 disables the first control signal 'ctrl1' to low state if the data 'Data' is the first level and enables the first control signal 'ctrl1' to a high state if the data 'Data' is the second level. In FIG. 3, the verify read controller 210 can include a first NAND gate ND1. The first NAND gate ND1 receives the verify read signal 'VRD' and the data 'Data' and generates the first control signal 'ctrl1'.

The normal read controller 220 generates a second control signal 'ctrl2' in response to the verify read signal 'VRD' and the normal read signal 'RD'. The normal read controller 220 enables the second control signal 'ctrl2' to a low state when the verify read signal 'VRD' is disabled and the normal read signal 'RD' is enabled. The normal read controller 220 disables the second control signal 'ctrl2' to a high state when the normal read signal 'RD' is disabled. In FIG. 3, the normal read controller 220 can include a first inverter IV1 and a second NAND gate ND2. The first inverter IV1 inverts the verify read signal 'VRD'. The second NAND gate ND2 receives the output of the first inverter IV1 and the normal read signal 'RD' and generates the second control signal 'ctrl2'.

The output unit 230 provides one of the first voltage 'Vref1', the reference voltage 'Vref0', and the second voltage 'Vref2' as the comparison voltage 'Vref' in response to the first and second control signals 'ctrl1 and ctrl2'. The output unit 230 provides the second voltage 'Vref2' as the comparison voltage 'Vref' when the first control signal 'ctrl1' is enabled to a high state and the second control signal 'ctrl2' is disabled to a high state. The output unit 230 provides the first voltage 'Vref1' as the comparison voltage 'Vref' when the first control signal 'ctrl1' is disabled to low and the second control signal 'ctrl2' is disabled to high. The output unit 230 provides the reference voltage 'Vref0' as the comparison voltage 'Vref' when the first control signal 'ctrl1' is disabled to a low state and the second control signal 'ctrl2' is enabled to a low state.

In FIG. 3, the output unit 230 can include second and third inverters IV2 and IV3 and first to third pass gates PG1 to PG3. The second inverter IV2 inverts the first control signal 'ctrl1' and the third inverter IV3 inverts the second control signal 'ctrl1'. Whether the first pass gate PG1 is turned-ON or OFF is determined in response to the first signal 'ctrl1' and the output of the second inverter IV2 to transmit the reference voltage 'Vref0' to the output node B. Whether the second pass gate PG2 is turned-ON or OFF is determined in response to the second signal 'ctrl2' and the output of the third inverter IV3 to transmit the second voltage 'Vref2' to the output node B. Whether the third pass gate PG3 is turned-ON or OFF is determined in response to the first signal 'ctrl1' and the output of the second inverter IV2 to transmit the first voltage 'Vref1' to the output node B.

Therefore, the voltage selecting unit 200 can provide the first and second voltages 'Vref1 and Vref2' to the comparison voltage 'Vref' according to the logic level of the data 'Data' when performing the verify read function and can provide the reference voltage 'Vref0' to the comparison voltage 'Vref' when performing the normal read function.

The function of the phase change memory apparatus 1 according to the embodiment will be described with reference to FIGS. 2 and 3.

First, a first data having a first level is written in the memory cell. Next, when the verify read signal 'VRD' is enabled, the voltage selecting unit 200 provides the first voltage 'Vref1' as the comparison voltage 'Vref'. The sense amplifier 100 differentially amplifies and outputs the sense amplifier input signal 'SAI' as a current penetrating through the memory cell and the sense amplifier 100 outputs the comparison voltage 'Vref' of the first voltage 'Vref1' level. When the output 'SAO' of the sense amplifier is not at the first level, a second data 'Data' having the same logic level as the first level and a higher voltage level than the first data 'Data' is rewritten in the memory cell. Then, when the verify read signal 'VRD' is enabled, the voltage selecting unit 200 provides the first voltage 'Vref1' as the comparison voltage 'Vref' and the sense amplifier 100 differentially amplifies and outputs the sense amplifier input signal 'SAI' and outputs the comparison voltage 'Vref' of the first voltage 'Vref1' level. When the output 'SAO' of the sense amplifier 100 is at the first level, the write verify function ends. When the output 'SAO' of the sense amplifier 100 is not at the first level, then the steps are repeated.

Also, a first data of the second level is written in the memory cell. Next, when the verify read signal 'VRD' is enabled, the voltage selecting unit 200 provides the second voltage 'Vref2' as the comparison voltage 'Vref'. The sense amplifier 100 differentially amplifies and outputs the sense amplifier input signal 'SAI' and the comparison voltage 'Vref' of the second voltage 'Vref2' level. When the output 'SAO' of the sense amplifier is not the second level, the second data 'Data' having the same logic level as the second level and a lower voltage level than the first data 'Data' is rewritten in the memory cell. Then, when the verify read signal 'VRD' is enabled, the voltage selecting unit 200 provides the second voltage 'Vref2' as the comparison voltage 'Vref' and the sense amplifier 100 differentially amplifies and outputs the sense amplifier input signal 'SAI' and the comparison voltage 'Vref' of the second voltage 'Vref2' level. When the output 'SAO' of the sense amplifier 100 is at the second level, the write verify function ends. When the output 'SAO' of the sense amplifier 100 is not at the second level, then the steps are repeated.

Thereafter, when the normal read signal 'RD' is enabled, the voltage selecting unit 200 outputs the reference voltage 'Vref0' as the comparison voltage 'Vref'. Therefore, the sense amplifier 100 differentially amplifies and outputs the sense amplifier input signal 'SAI' and the comparison voltage 'Vref' of the reference voltage 'Vref0' level. Since the data 'Data' of the first level are stored in the memory cell at the first voltage 'Vref1' level higher than the reference voltage 'Vref0' and since the second level data 'Data' are stored in the memory cell at the second voltage 'Vref2' level lower than the reference voltage 'Vref0', then the phase change memory apparatus 1 with the write verify function can output the stable and correct data when performing the normal read function.

Figure 4:
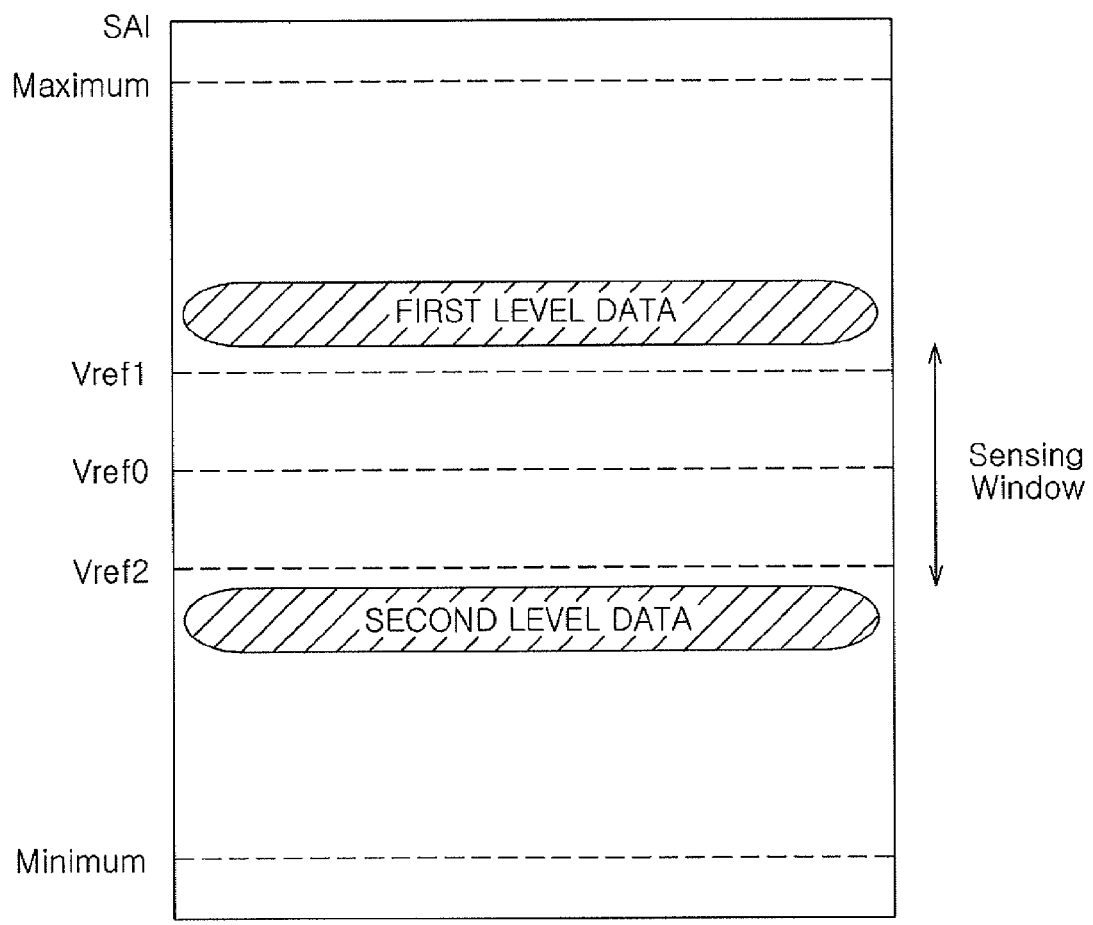
FIG. 4 is a graph showing distribution of data that are stored in a memory cell of a phase change memory apparatus according to the embodiment.

FIG. 4 is a graph showing the distribution of data stored in the memory cell of the phase change memory apparatus according to the embodiment. In FIG. 4, it can be appreciated that the first level data are distributed above the first voltage 'Vref1' and the second level data is distributed below the second voltage 'Vref2'. Therefore, the phase change memory apparatus 1 according to the embodiment can secure sufficient sensing window even when data skew, switching skew, and PVT fluctuations occur.

Figure 5:
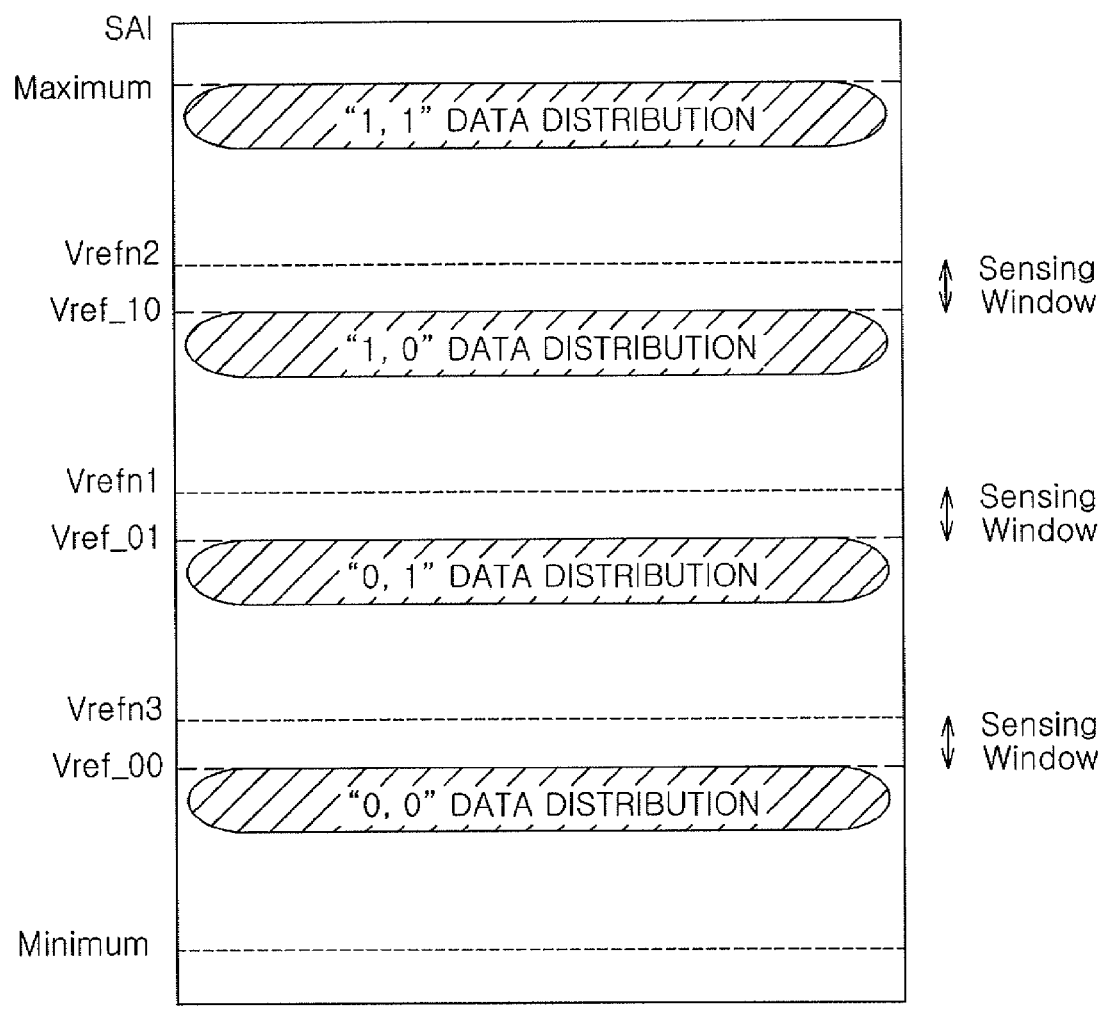
FIG. 5 is a graph showing distribution of data that are stored in the memory cell of the phase change memory apparatus that adopts a multi level cell.

The embodiment representatively describes the single level cell (SLC) that stores the data in the memory cell as '1' or '0', but it is envisioned herein that this technical idea of the embodiment can also be applied to the multi level cell. The multi level cell (MLC) corresponds to the case where the data of more than 2 bits stored in the memory cell is formed. For example, the phase change memory apparatus adopting the multi level cell (MLC) can store the data '0, 0', '0, 1', '1, 0', '1, 1' in the memory cell by using the difference between the voltage levels. The example is shown in FIG. 5. In the case of the phase change memory apparatus adopting the multi level cell (MLC), three sense amplifiers may be needed for each memory cell. In order to apply this technical idea of the embodiment, when the write verify function is performed using a plurality of voltages 'Vref_00, Vref_01, Vref_10, Vrefn1, Vrefn2, and Vrefn3', the sensing window between the data of 2 bits is sufficiently secured, making it possible to stably and accurately output data.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A phase change memory apparatus comprising the memory cell such that the apparatus is configured to perform a write verify function in the memory cell, wherein the phase change memory apparatus is configured to write a first state level data or a second state level data in the memory cell such that when the first state level data is written, then the apparatus is configured to perform a verify read function with a first voltage level, and when the second state level data is written, then the apparatus is configured to perform the verify read function with a second voltage level which has a different voltage level from the first voltage level.

2. The phase change memory apparatus according to claim 1, wherein the first voltage level is higher than a reference voltage and the second voltage level is lower than the reference voltage.

3. The phase change memory apparatus according to claim 2, wherein the apparatus is configured to perform a normal read function using the reference voltage.

4. A phase change memory apparatus comprising: a phase change memory cell; a sense amplifier configured to differentially amplify a current that through the memory cell and a comparison voltage; and a voltage selecting unit configured to provide a reference voltage as the comparison voltage when performing a normal read function and to selectively provide either a first voltage level or a second voltage level which has a different voltage level from the first voltage level as the comparison voltage in accordance with data when performing a verify read function.

5. The phase change memory apparatus according to claim 4, wherein the first voltage level is higher than the reference voltage and the second voltage level is lower than the reference voltage.

6. The phase change memory apparatus according to claim 5, wherein the voltage selecting unit comprises: a verify read controller configured to generate a first control signal in response to a verify read signal and the data; a normal read controller configured to generate a second control signal in response to the verify read signal and the normal read signal; and an output unit configured to output anyone of the first voltage level, the second voltage level, and the reference voltage as the comparison voltage in response to the first and second control signals.

7. The phase change memory apparatus according to claim 6, wherein when the verify read signal is enabled, then the verify read controller disables the first control signal if the data is at a first state level and enables the first control signal if the data is a second state level.

8. The phase change memory apparatus according to claim 7, wherein the output unit is configured to provide the second voltage level as the comparison voltage when the first control signal is enabled and to provide the first voltage level as the comparison voltage when the first control signal is disabled.

9. The phase change memory apparatus according to claim 6, wherein the normal read controller disables the second control signal when the verify read signal is enabled, and the normal read controller enables the second control signal when the verify read signal is disabled when the normal read signal is enabled.

10. The phase change memory apparatus according to claim 9, wherein the output unit provides the reference voltage as the comparison voltage when the second control signal is enabled.

* * * * *